(12) United States Patent
Waite et al.

(10) Patent No.: US 7,157,374 B1
(45) Date of Patent: Jan. 2, 2007

(54) METHOD FOR REMOVING A CAP FROM THE GATE OF AN EMBEDDED SILICON GERMANIUM SEMICONDUCTOR DEVICE

(75) Inventors: Andrew M. Waite, Wappingers Falls, NY (US); Huicai Zhong, Wappingers Falls, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 73 days.

(21) Appl. No.: 10/876,544

(22) Filed: Jun. 28, 2004

(51) Int. Cl.
*H01L 21/302* (2006.01)
(52) U.S. Cl. ............... 438/689; 438/184; 438/197; 438/199; 438/224; 438/231; 438/301; 438/558; 257/19; 257/20; 257/24; 257/336; 257/382; 257/400; 257/900
(58) Field of Classification Search ........ 438/299–303; 257/19, 20
See application file for complete search history.

(56) References Cited

U.S. PATENT DOCUMENTS 6,657,223 B1 * 12/2003 Wang et al. ............... 257/19
6,881,635 B1 * 4/2005 Chidambarrao et al. .... 438/300
6,972,222 B1 * 12/2005 Cho et al. .................. 438/197

OTHER PUBLICATIONS

S.Wolf, Silicon Processing for the VLSI Era, vol. 1 Lattice Press (1986), pp. 521-526, 529-536, 555-556.*
B.Streetman, Solid State Electronic Devices, 3rd Edn. Prentice Hall, (1990), pp. 347-349.*
Waite, A., et al. "A Novel Deep Submicron Elevated Source/Drain MOSFET." pp. 148-151 no date.
Ghani, T., et al. "A 90nm high Volume Manufacturing Logic Technology Featuring Novel 45nm Gate Length Strained Silicon CMOS Transistors." IEDM 2003, pp. 1-17, date unavailable.

* cited by examiner

*Primary Examiner*—Nadine Norton
*Assistant Examiner*—Maki Angadi

(57) ABSTRACT

A method of removing the cap from a gate of an embedded SiGe semiconductor device includes the formation of the embedded SiGe semiconductor device with the cap consisting of a cap material on top of the gate, first sidewall spacers on side surfaces of the gate, and embedded SiGe in source and drain regions. Second sidewall spacers are formed on the first sidewall spacers, these second sidewall spacers consisting of a material different from the cap material. The cap is stripped from the top of the gate with an etchant that selectively etches the cap material and not the second sidewall spacer material.

17 Claims, 5 Drawing Sheets

METHOD FOR REMOVING A CAP FROM THE GATE OF AN EMBEDDED SILICON GERMANIUM SEMICONDUCTOR DEVICE

FIELD OF THE INVENTION

The present invention relates to the field of semiconductor manufacture, and more particularly, to the formation of embedded silicon germanium (SiGe) devices.

BACKGROUND OF THE INVENTION

An important aim of ongoing research in the semiconductor industry is increasing semiconductor performance while decreasing power consumption in semiconductor devices. Planar transistors, such as metal oxide semiconductor field-effect transistors (MOSFETs), are particularly well-suited for use in the high-density integrated circuits. As the size of MOSFETs and other devices decrease, the dimensions of source/drain regions, channel regions, and gate electrodes of the devices, also decrease.

As micro-miniaturization of devices and circuits proceeds, there is an attendant need to increase the drive current of transistors by enhancing carrier mobility. Substrates based on "strained silicon" have attracted much interest as a semiconductor material which provides increased speeds of electron and hole flow therethrough, thereby permitting fabrication of semiconductor devices with higher operating speeds, enhanced performance characteristics, and lower power consumption. In such a device, a very thin, tensely strained, crystalline silicon (Si) layer is grown on a relaxed, graded composition of SiGe buffer layer several microns thick, which SiGe buffer layer in turn is formed on a suitable crystalline substrate, e.g., a silicon wafer or a silicon-on-insulator (SOI) wafer. Strained silicon technology is based upon the tendency of silicon atoms, when deposited on a SiGe buffer layer, to align with the greater lattice constant (spacing) of SiGe atoms (relative to pure silicon).

As a consequence of the silicon atoms being deposited on a substrate (SiGe) comprised of atoms which are spaced further apart, they "stretch" to align with the underlying SiGe atoms, thereby "stretching" or tensely straining the deposited silicon layer. The electrons in such tensile strained silicon layers have greater mobility than in conventional, relaxed silicon layers with smaller inter-atom spacings, i.e., there is less resistance to electron and/or hole flow.

One method for applying compressive strain to the channels of p-channel MOSFET devices is known as an embedded SiGe technique. Such a technique applies uniaxial compressive strain to the channels of the PFET devices. In this technique, recesses are etched in the source and drains of the MOSFET devices, and are filled with selective epitaxial SiGe. Since the lattice constant of SiGe is different from that of silicon, mechanical strain is induced in the crystal layers to accommodate the lattice mismatch. The embedded geometry plus the compressive source/drain caused by the mismatch produces a relatively large uniaxial compressive channel strain. This produces a large enhancement in hole mobility.

One of the concerns about forming such a strained p-MOSFET structure is the potential of growing epitaxial SiGe on the polysilicon gate. One of the ways for protecting the gate is through a cap formed on top of the gate. Removal of the cap, however, can damage the sidewall spacers provided on the sides of the gate.

SUMMARY OF THE INVENTION

There is a need for a method of forming an embedded SiGe semiconductor device while preventing growth of epitaxial SiGe on the polysilicon at the top of the gate, in a manner that does not compromise the sidewall spacers.

This and other needs are met by embodiments of the present invention which provide a method of removing a cap from a gate of an embedded SiGe semiconductor device, comprising the steps of forming the embedded SiGe semiconductor device with a cap consisting of a cap material on top of the gate, first sidewall spacers on side surfaces of the gate, and embedded SiGe in source and drain regions. The method also comprises forming second sidewall spacers on the first sidewall spacers, these second sidewall spacers consisting of a material different from the cap material. The cap is stripped from the top of the gate with an etchant that selectively etches the cap material and not the second sidewall spacer material.

By forming the second sidewall spacers on the first sidewall spacers, the cap can be stripped with the first sidewall spacers being protected from etching by the second sidewall spacers.

The earlier stated needs are also met by other embodiments of the present invention which provide a method of manufacturing a semiconductor device arrangement comprising the steps of forming PFET and NFET devices on a wafer. The PFET devices are embedded SiGe PFETs. The PFET and NFET devices have first sidewall spacers and gates with caps. The method also comprises removing the caps without substantially etching the first sidewall spacers.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the formation of arrangements having embedded SiGe FETs. In particular, the present invention addresses problems related to protecting the polysilicon gate from growth of epitaxial SiGe during manufacture. This is accomplished by providing a cap, such as a silicon nitride cap, on top of the gate electrode prior to the formation of the embedded SiGe regions. A spacer layer is formed over the sidewall spacers and the cap. The spacer layer is then etched to form second sidewall spacers on the first sidewall spacers, with the caps being exposed. An etching, either a wet or a dry etching, is performed to remove the silicon nitride cap. The second sidewall spacers, which may be made of an oxide material, protect the first sidewall spacers (formed of silicon nitride, for example) during the stripping of the cap. Following the cap strip step, semiconductor processing may proceed as normal, including formation of silicide regions in the gate and source and drain regions.

Figure 1:
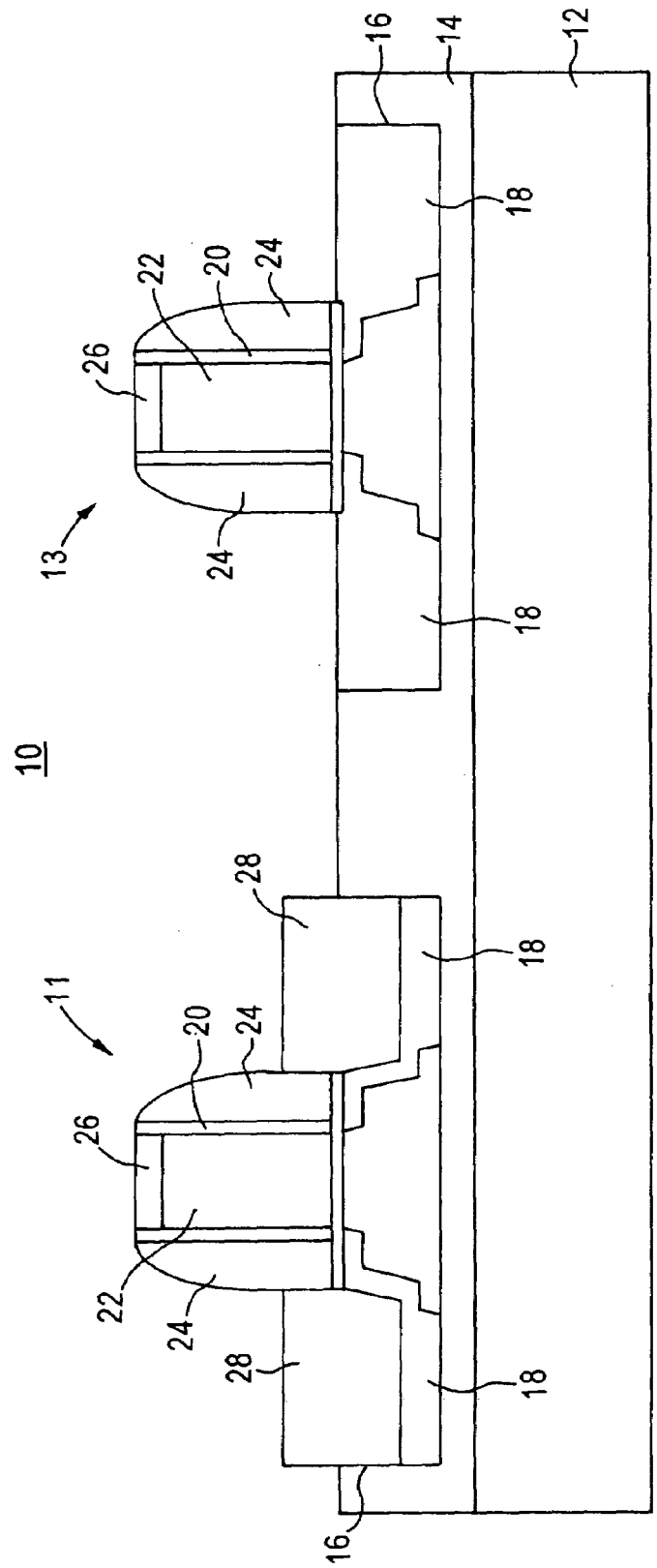
FIG. 1 is a cross-section of a portion of a semiconductor arrangement having an embedded SiGe PFET and an NFET, depicted during one phase of manufacture in accordance with methods of the present invention.

FIG. 1 depicts a cross-section of a semiconductor arrangement during one phase of manufacture in accordance with embodiments of the present invention. The arrangement 10 includes a PFET 11 and an NFET 13. The PFET 11 and NFET 13 are located on a silicon-on-insulator "SOI" arrangement, for example, but can be on a bulk silicon layer in other embodiments. A oxide layer 14, formed of a buried oxide layer and a shallow trench isolation (STI) oxide, for example, is provided on a silicon substrate 12. Body areas 16, formed of silicon, for example, are provided within the oxide layer 14. In a conventional manner, the PFETs 11 and NFETs 13 are formed. This includes the creation of polysilicon gates 22, source and drain regions 18 and source and drain extensions.

Each of the PFETs 11 and NFETs 13 include a liner oxide/offset spacer 20. First sidewall spacers 24 are provided on the liner oxide/offset spacer 20, for both the PFETs 11 and NFETs 13. The first sidewall spacers are made of silicon nitride, for example. The top of each of the gates 22 is capped by a cap 26, which may also be made of silicon nitride, for example. In certain embodiments of the invention, the first sidewall spacers 24 and the cap 26 are made of the same material, such that removal of the cap 26 by etching could potentially damage the material of the first sidewall spacers 24, unless preventive measures are taken.

The PFET 11 is an embedded SiGe PFET, and includes embedded SiGe regions 28 that have been deposited by selective epitaxy. In this process, recesses are first etched into the silicon of the body area 16 at the source and drains 18 in the PFETs 11. The caps 26 on top of the gates 22 protect the polysilicon of the gates 22 from being etched during this process. The NFETs 13 are masked off so as not to etch the sources and drains 18 during that period.

Following the etching of the recesses in the sources and drains 18 in the PFETs 18, a selective epitaxial deposition of SiGe on the silicon in the body areas 16 of the PFETs 11 is performed, to create SiGe regions 28. During this step, the cap 26 protects the top of the gate electrode 22 and the PFET 11 from the growth of epitaxial SiGe. The NFETs are still masked off to prevent growth on the sources and drains 18.

Figure 2:
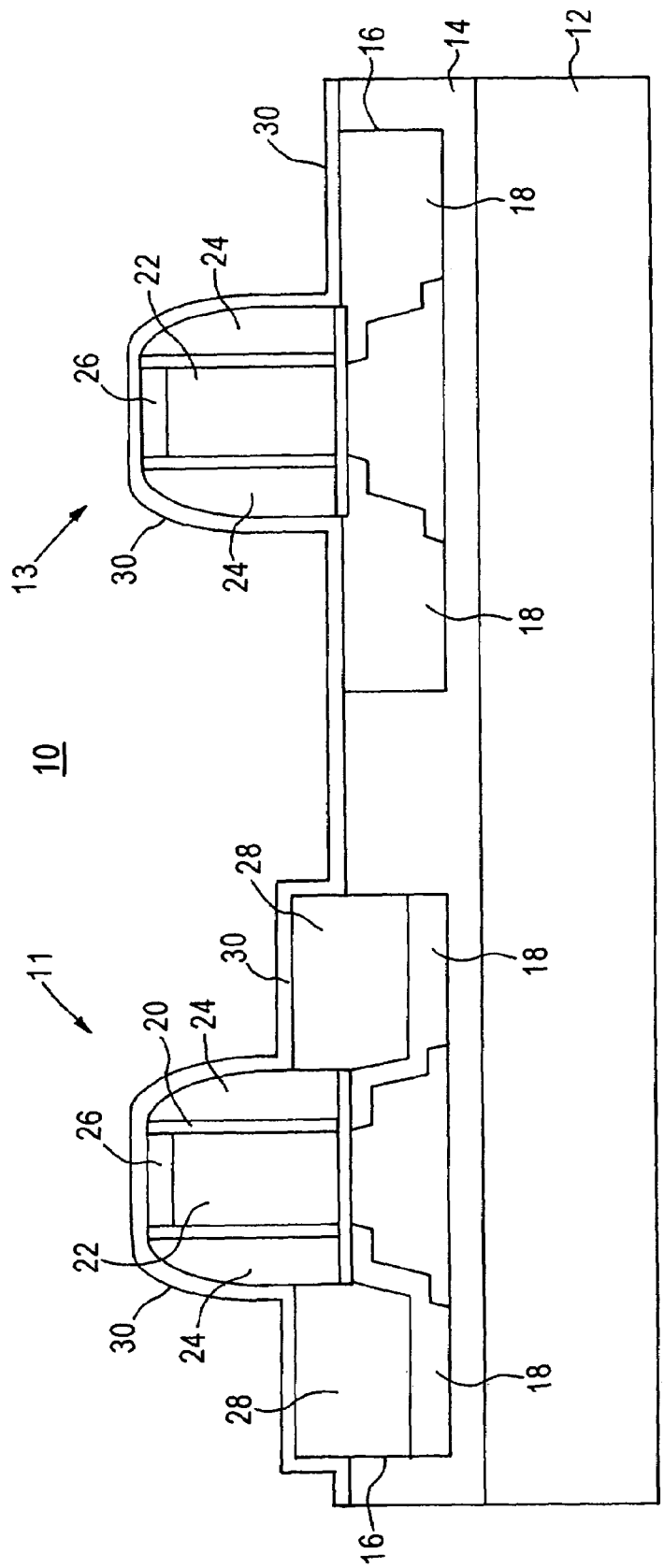
FIG. 2 shows the structure of FIG. 1 following the deposition of a second sidewall spacer layer in accordance with the embodiments of the present invention.

Once the structure in FIG. 1 has been created, the cap 26 has to be removed without substantially etching the sides of the first sidewall spacers 24, which are made of the same material as the cap 26. In certain embodiments of the invention, this material is silicon nitride. Accordingly, in FIG. 2, the present invention provides a second sidewall spacer material layer 30, which in certain embodiments of the invention is an oxide layer. It is possible but not essential to employ a thin second sidewall spacer material layer 30, in the order of 3 nm to 6 nm thick, for example. Maintaining a relatively thin second sidewall spacer material layer allows the distance between the silicide 38 and the polysilicon gate electrode 22 to be kept to a minimum, to enhance device performance by reducing the electrical series resistance between the silicide 38 and the edge of the channel of the MOSFET. A conventional methodology for depositing the second sidewall spacer material layer 30 may be employed.

Figure 3:
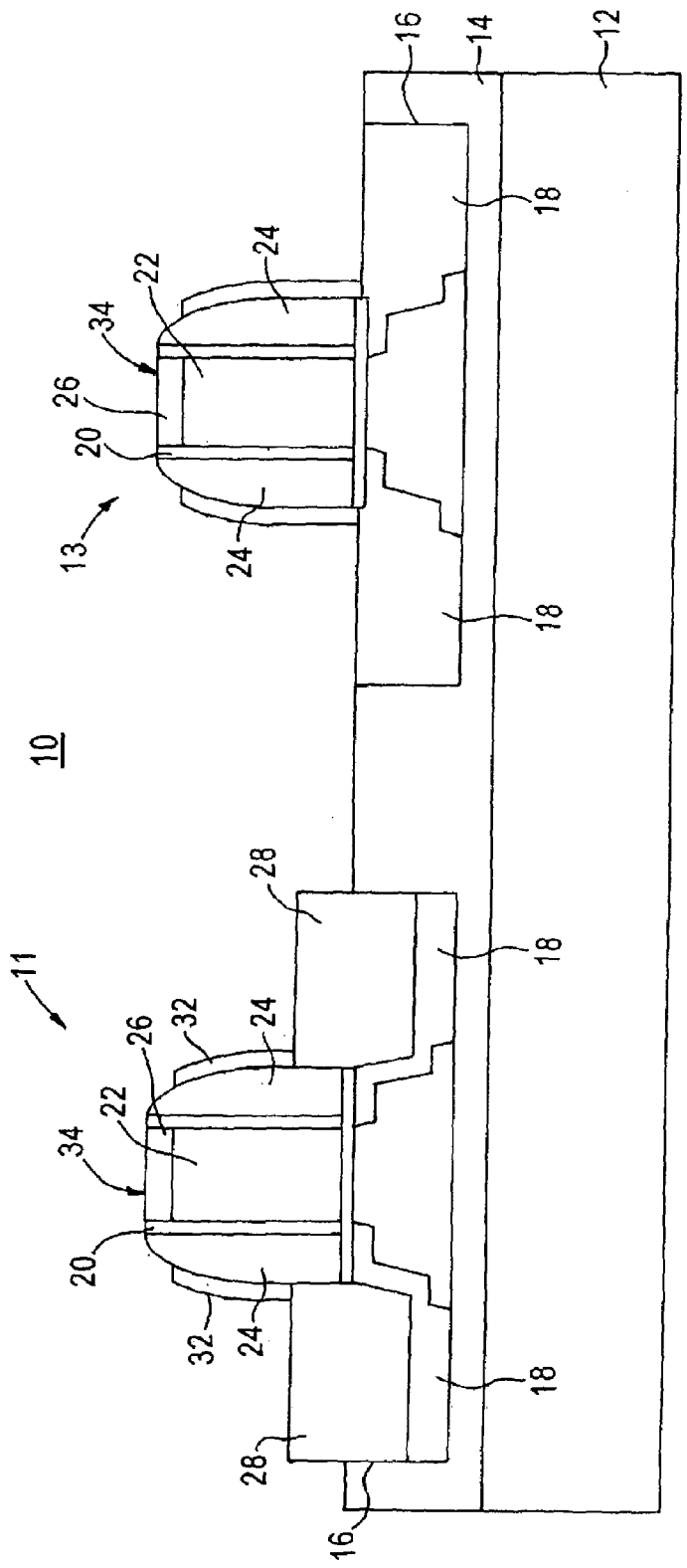
FIG. 3 depicts the structure of FIG. 2 following an anisotropic etch to form the second sidewall spacers on the first sidewall spacers, in accordance with embodiments of the present invention.

In FIG. 3, an etching process, such as an anisotropic dry etch, is performed to expose the caps 26 and form relatively thin second sidewall spacers 32 on the sides of the first sidewall spacers 24. A conventional anisotropic dry etch process may be employed to create the second sidewall spacers 32 and expose the tops 34 of the caps 26.

Following the formation of the second sidewall spacers 32, an etching process is performed to strip the caps 26 and expose the top surfaces 36 of the gates 22. This etch may be a wet etch or a dry etch. For example, when silicon nitride is employed as the cap material for the caps 26, hot phosphoric acid may be used to strip the caps 26. Alternatively, a dry etch may be used to strip the caps 26.

Whether a wet etch or a dry etch is employed, the first sidewall spacers 24 need to be protected during the stripping of the caps 26. This is achieved by the second sidewall spacers 32. This is because the second sidewall spacers 32 are made of a material that will not be substantially etched during the cap stripping process. For example, in the exemplary described embodiment, the caps 26 are made of silicon nitride and the second sidewall spacer material is an oxide. During a wet etch process, for example, employing hot phosphoric acid, only the silicon nitride in the caps 26 will be etched, and the second sidewall spacers 32 will not be affected by the hot phosphoric acid. During this etch, the oxide protects the sidewalls of the first sidewall spacers 24.

Figure 4:
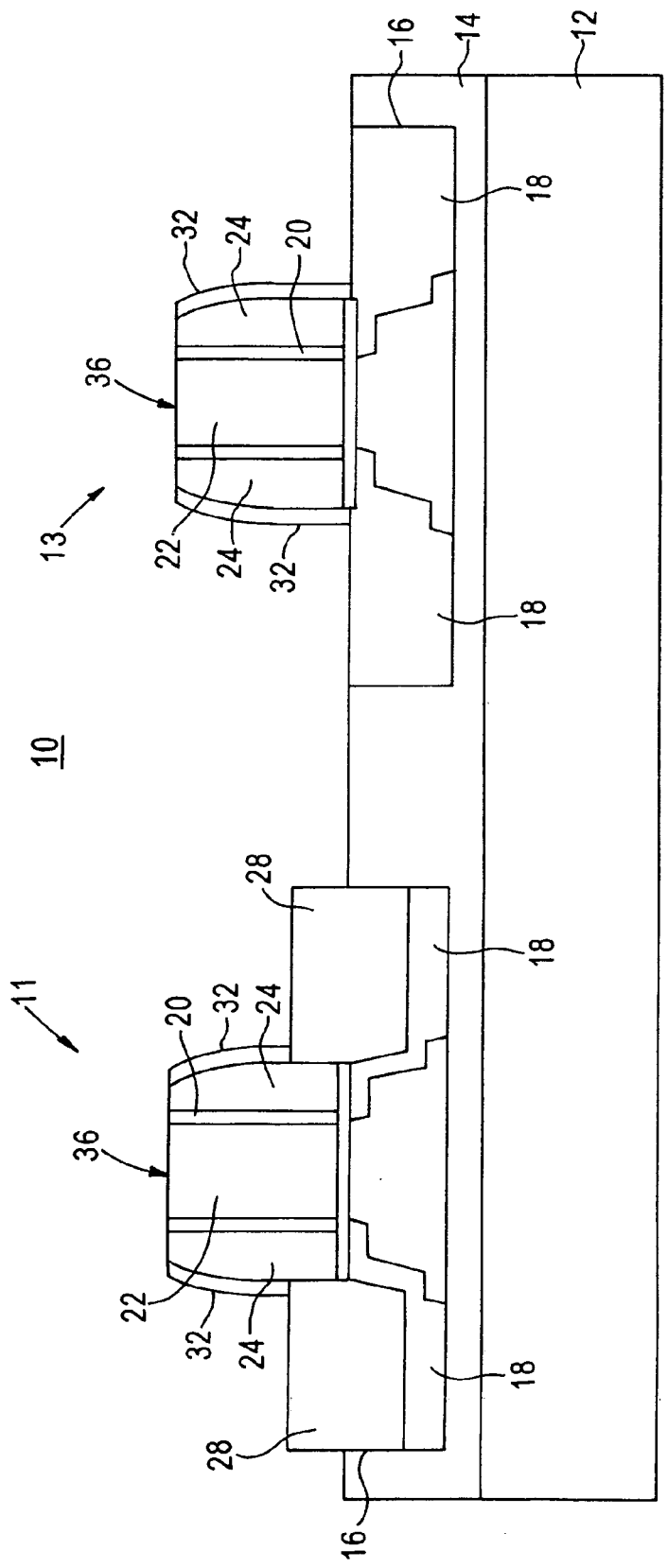
FIG. 4 shows the structure of FIG. 3 after stripping of the caps in accordance with embodiments of the present invention.
Figure 5:
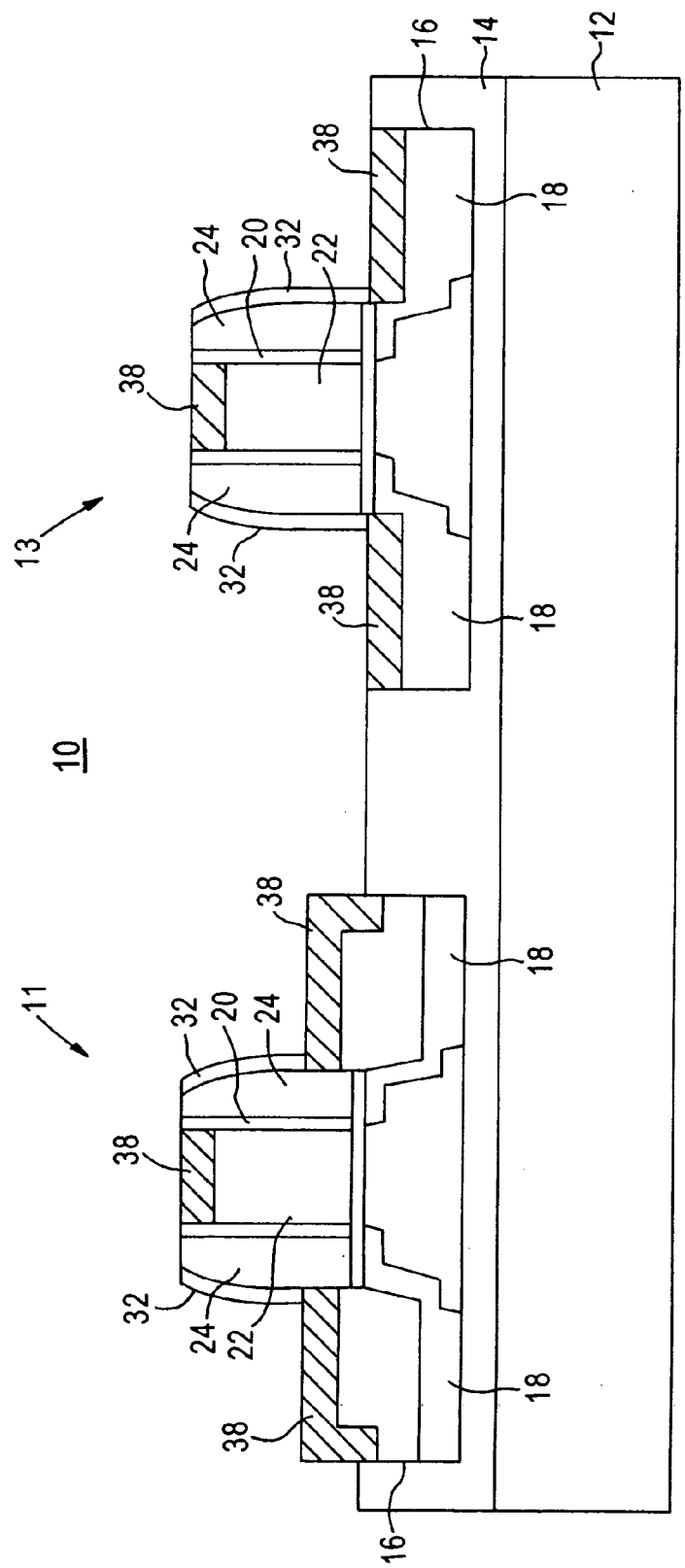
FIG. 5 shows the structure of FIG. 4 following the formation of silicide in the gates, sources and drains of the PFETs and NFETs of the arrangement, in accordance with embodiments of the present invention.

With the caps 26 now removed by the etching process, and the first sidewall spacers 24 protected during the etch process, as depicted in FIG. 4, the formation of the PFETs 11 and NFETs 13 can now be completed. In FIG. 5, a silicide 38 is grown on top of the polysilicon gates 22 as well as the source and drains 18. In the PFETs 11, the silicide is formed in the SiGe portions 28 of the sources and drains 18. The second sidewall spacers 32 remain in place after the salicidation process. A conventional salicidation process may be employed to create the silicide regions 38. If the second sidewall spacers 32 are very thin, they have substantially little effect on the series resistance between the silicide and the edge of the channel.

With the present invention, a production-worthy method of forming embedded SiGe devices is provided. Epitaxial growth of SiGe on top of the gate electrodes is prevented by caps, and the caps are removed by a method that prevents compromising the integrity of the first sidewall spacers.

Although the present invention has been described and illustrated in detail, it is to be clearly understood that the same is by way of illustration and example only, and is not to be taken by way of limitation, the scope of the present invention being limited only by the terms of the appended claims.

What is claimed is:

1. A method of removing a cap from a gate of an embedded SiGe semiconductor device, comprising the steps of:

forming the embedded SiGe semiconductor device with the cap consisting of a cap material on top of the gate, offset spacers on side surfaces of the gate, first sidewall spacers on the offset spacers, and embedded SiGe in source and drain regions;

forming second sidewall spacers on the first sidewall spacers, the second sidewall spacers consisting of a material different from the cap material; and stripping the cap from the top of the gate with an etchant that selectively etches the cap material and not the second sidewall spacer material.

2. The method of claim 1, wherein the step of forming the second sidewall spacers includes depositing the second sidewall spacer material over the cap and the first sidewall spacers.

3. The method of claim 2, wherein the step of forming the second sidewall spacers further includes anisotropically etching the second sidewall spacer material to expose the cap and form the second sidewall spacers.

4. The method of claim 3, wherein the first sidewall spacers and the cap material consist of a nitride and the second sidewall spacers consist of an oxide.

5. The method of claim 4, wherein the etchant for stripping the cap includes hot phosphoric acid.

6. The method of claim 5, wherein the step of forming the embedded SiGe semiconductor device includes etching source and drain regions of the semiconductor device and selectively epitaxially growing SiGe on the source and drain regions.

7. The method of claim 6, wherein the step of forming the embedded SiGe semiconductor device further includes forming the cap on top of the gate prior to the etching of the source and drain regions.

8. The method of claim 4, wherein the cap is stripped by dry etching.

9. A method of manufacturing a semiconductor device arrangement, comprising:
    forming PFET and NFET devices on a wafer, the PFET devices being embedded SiGe PFETs, the PFET and NFET devices having offset spacers on gates, caps on the gates, first sidewall spacers on the offset spacers, and second sidewall spacers on the first sidewall spacers; and
    removing the caps without substantially etching the first sidewall spacers.

10. The method of claim 9, wherein the first sidewall spacers consist of a nitride.

11. The method of claim 10, wherein the cap consists of a nitride.

12. The method of claim 11, wherein the step of removing the caps includes forming second sidewall spacers on the first sidewall spacers, with the caps exposed.

13. The method of claim 12, wherein the step of forming second sidewall spacers includes depositing an oxide layer over the first sidewall spacers and the cap.

14. The method of claim 13, wherein the step of forming second sidewall spacers includes anisotropically etching the oxide layer to expose the caps and form the second sidewall spacers.

15. The method of claim 14, wherein the step of removing the caps includes wet etching the caps.

16. The method of claim 15, wherein the step of wet etching the caps includes etching the caps with hot phosphoric acid.

17. The method of claim 14, wherein the step of removing the caps includes dry etching the caps selectively without etching the second sidewall spacers, the second sidewall spacers protecting the sides of the first sidewall spacers from being etched.

* * * * *